United States Patent
Choi et al.

(10) Patent No.: US 6,490,222 B2
(45) Date of Patent: Dec. 3, 2002

(54) DECODING CIRCUIT FOR CONTROLLING ACTIVATION OF WORDLINES IN A SEMICONDUCTOR MEMORY DEVICE

(75) Inventors: Jong-Hyun Choi, Kyunggi-do (KR); Sang-Seok Kang, Kyunggi-do (KR); Jei-Hwan Yoo, Kyunggi-do (KR); Jae-Hoon Joo, Kyunggi-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/875,371

(22) Filed: Jun. 5, 2001

(65) Prior Publication Data

US 2002/0006073 A1 Jan. 17, 2002

(30) Foreign Application Priority Data

Jul. 12, 2000 (KR) .............................................. 00-39993

(51) Int. Cl.[7] ................................................. G11C 8/00
(52) U.S. Cl. .................. 365/230.06; 365/203; 365/233; 365/201
(58) Field of Search .......................... 365/203, 230.06, 365/233, 201

(56) References Cited

U.S. PATENT DOCUMENTS

| | | | | |
|---|---|---|---|---|
| 5,047,983 A | * | 9/1991 | Iwai et al. ................... | 365/200 |
| 5,373,471 A | * | 12/1994 | Saeki et al. ............ | 365/189.04 |
| 5,631,871 A | * | 5/1997 | Park et al. .................. | 365/203 |
| 5,798,973 A | * | 8/1998 | Isa .............................. | 365/200 |
| 5,864,508 A | * | 1/1999 | Takashima et al. .... | 365/189.11 |
| 6,055,206 A | * | 4/2000 | Tanizaki et al. ............ | 365/229 |
| 6,088,286 A | * | 7/2000 | Yamauchi et al. ...... | 365/230.03 |

* cited by examiner

Primary Examiner—Andrew Q. Tran
Assistant Examiner—Toan Le
(74) Attorney, Agent, or Firm—Marger Johnson & McCollom, P.C.

(57) ABSTRACT

A semiconductor memory device of the invention includes: main decoders for generating wordline enable signals in response to first decoding signals, a first precharge signal, and a second precharge signal; wordline drivers for wordline drive signals in response to the wordline enable signals and second decoding signals; and a circuit for generating the second precharge signal in response to a command signal. The wordline drive signals are inactivated in sequence in response to the first decoding signals and the second precharge signal, in order to reducing ground noises.

13 Claims, 11 Drawing Sheets

DECODING CIRCUIT FOR CONTROLLING ACTIVATION OF WORDLINES IN A SEMICONDUCTOR MEMORY DEVICE

BACKGROUND OF THE INVENTION

1. Cross-References to Related Applications

This application relies for priority upon Korean Patent Application No. 2000-39993, filed on Jul. 12, 2000, the contents of which are herein incorporated by reference in their entirety.

2. Field of the Invention

The present invention is in the field of a semiconductor memory device and is more specifically related to a decoding circuit for controlling activation of wordlines in a semiconductor memory device for a test function.

3. Description of the Prior Art

A high-density memory such a dynamic random access memory (RAM) has various test operation modes for verifying reliability thereof. The tests are carried out with various conditions and circumstance before and after completing a fabricating process. One of the test functions applied on a dynamic RAM is a burn-in test where stress of high voltage impacts on memory cells thereof and then primary defects such as micro-bridges are detected. The micro-bridges are induced from undesired short circuit phenomenon due to particles or impurities making electrically conductive paths between lines (e.g., wordlines or bitlines) which should not form a short circuit or a direct interconnection.

Figure 1A:
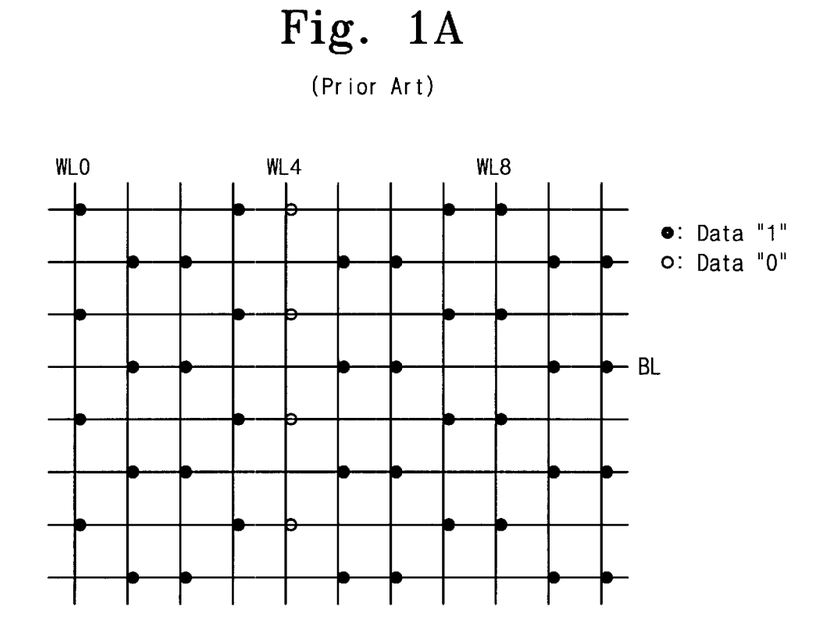
FIGS. 1A and 1B are schematic diagrams illustrating activation patterns of wordlines for a micro-bridge test known in the art.
Figure 1B:
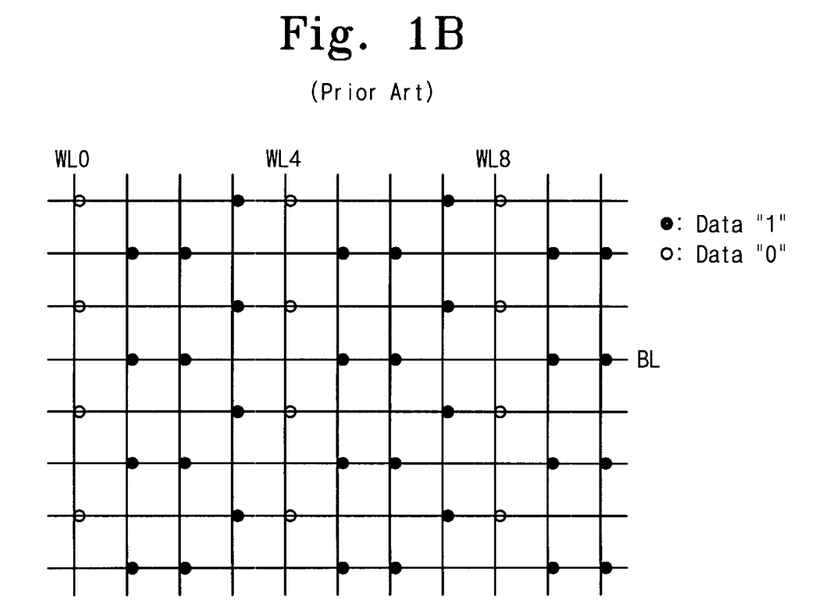

FIGS. 1A and 1B show wordline activation patterns to find out micro-bridges over a memory cell array of a dynamic RAM. Referring to FIG. 1A, for screening micro bridges, data "1" is written in all memory cells, and then data "0" is written in memory cells coupled to one wordline. Thereafter, the wordline coupled to the memory cells storing the data "0" is activated for a time and set on a test voltage (i.e., high voltage for stress). If there is a micro-bridge between the memory cells storing "0" and "1", the data of the memory cells which has stored data "1" is changed to "0", which indicates that there is a micro-bridge between the bitlines of the memory cells.

It is known to activate a wordline at intervals of four wordlines, as shown in FIG. 1B. This method results in a reduced test time for micro-bridges to one-fourth that of FIG. 1A. If, for example, the number of wordlines in a unit array block is 512, then the active pattern of wordlines for the flow of the test operation are wordlines WL0, WL4, . . . , WL508. These wordlines, activated until the end of a stress time (step S24-FIG. 3) and coupled to memory cells storing data "0", are all turned off at the same time. Since this method results in a number of the wordlines (i.e., 128 wordlines per the unit array block) being set to a low level (e.g. ground voltage) from high level, bouncing noises at the ground level (or ground noises) are induced thereby causing an increase of the ground voltage level that makes the low level be instantly higher. As a result, the data "1" stored in the memory cells coupled to the deactivated wordlines are undesirably changed into "0" because charges in the 1-storing memory cells are flow out from their bitlines.

SUMMARY OF THE INVENTION

The present invention is intended to solve these problems. It is an object of the invention to provide a decoding circuit capable of reducing ground noises in a test operation mode.

It is another object of the invention to provide a decoding circuit capable of performing a reliable test operation without an invalid disturbance.

It is yet another object of the invention to provide a method for testing the presence of micro-bridges without ground noises.

In order to accomplish those objects, a semiconductor memory device of the invention includes: main decoders for generating wordline enable signals in response to first decoding signals, a first precharge signal, and a second precharge signal; wordline drivers for wordline drive signals in response to the wordline enable signals and second decoding signals; and a circuit for generating the second precharge signal in response to a command signal. The wordline drive signals are inactivated in sequence in response to the first decoding signals and the second precharge signal, in order to reducing ground noises.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures., like reference numerals denote like or corresponding parts.

DETAILED DESCRIPTION OF PREFERRED EMBODIMENTS

Herein below, applicable embodiments of the invention will be as follows, with the appended drawings.

Figure 2:
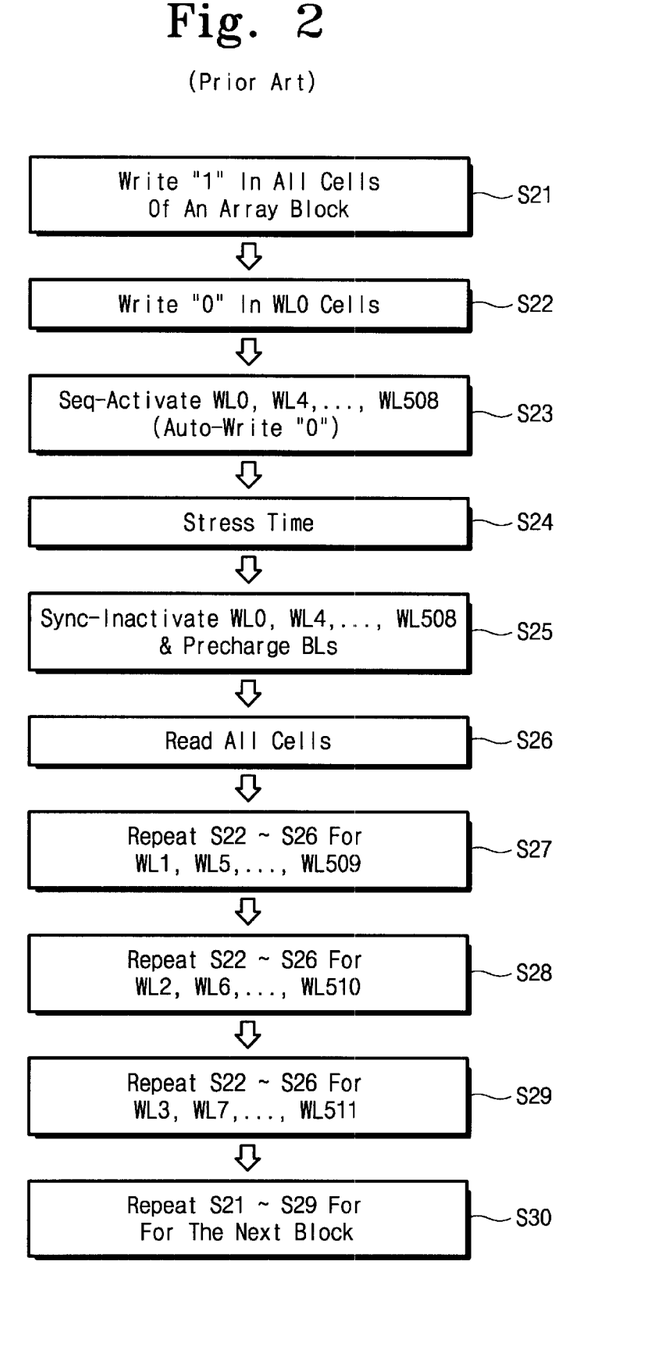
FIG. 2 is a flow chart of a conventional micro-bridge test operation with activation of wordlines according to methods known in the art.
Figure 3:
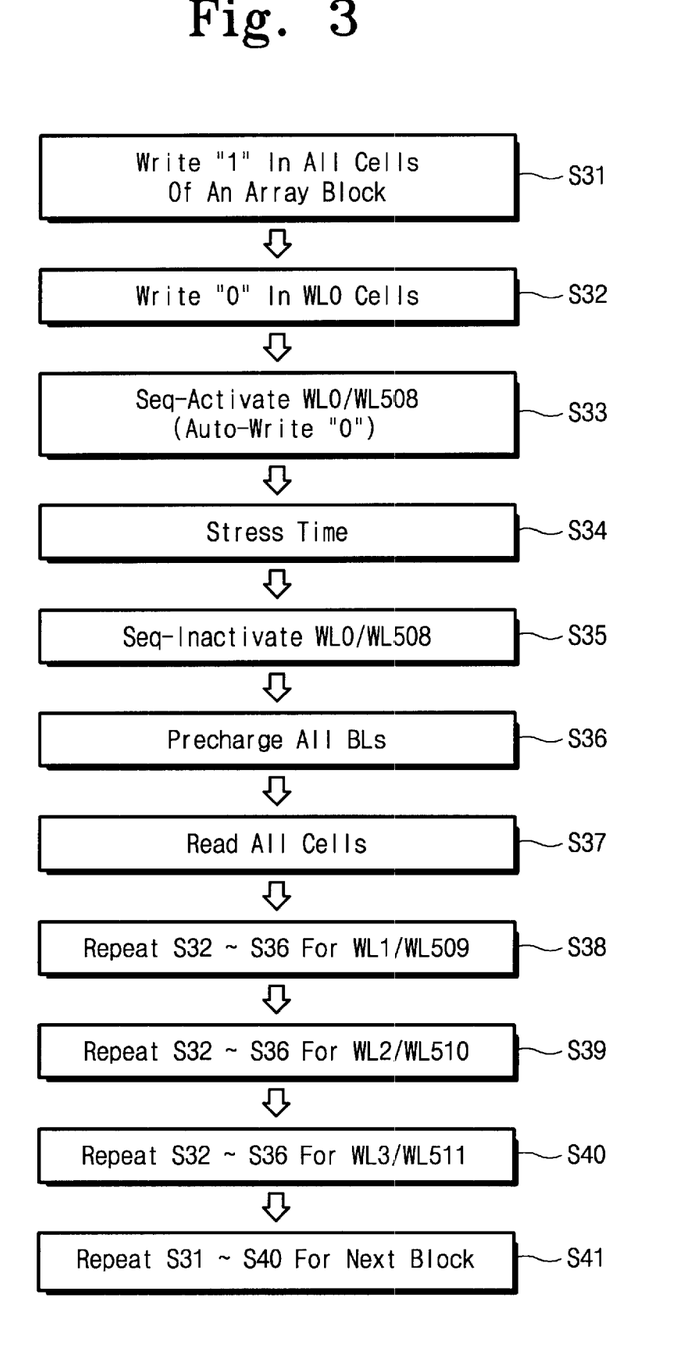
FIG. 3 is a flow chart of a micro-bridge test operation according to a preferred embodiment of the invention.

FIG. 3 shows a sequential flow for testing micro-bridges, according to an embodiment of the invention. Referring to FIG. 3, steps S31~S34 and S37~S41 are identical to the conventional steps S21~S24 and S26~S30 of FIG. 2, and steps S35 and S36 are different from the conventional step S25 of FIG. 2. Also, it is assumed that a test operation is carried out by units of array blocks each of which includes 512 wordlines. After writing "1" in all memory cells in one array block (S31), writing "0" in memory cells coupled to wordline WL0 (S32), sequentially activating WL0, WL4, . . . , WL508 (hereinafter, referred to as "WL0/WL508") at S33, and maintaining a current state for a predetermined stress time (S34), the activated wordlines WL0/WL508 (hereinafter, referred to as "a first wordline group") are turned off sequentially as they have been activated (S35).

After the activation of the first wordline group is over, all of bitlines in the first-selected array block are precharged to a predetermined bitline voltage at step S36. Next, micro bridges detection is accomplished by reading memory cells one by one. And, the steps S32~S37 are repeated for the next wordline groups, i.e., WL1/WL509, WL2/WL510, and WL3/WL511, in order, through steps S38, S39, and S40, respectively. After the test for the first selected array block, the next array block is put into the steps S31 through S40.

Figure 4:
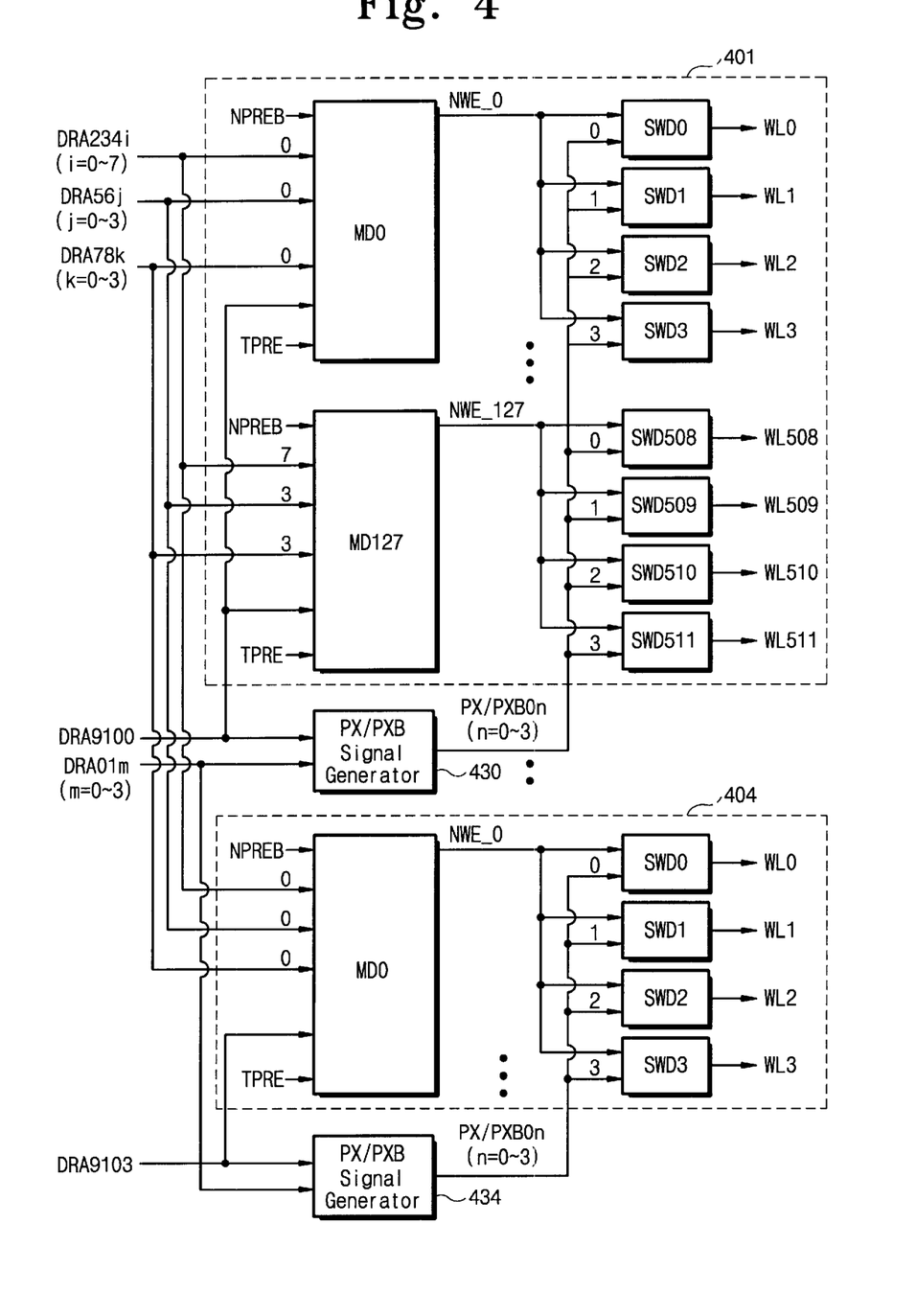
FIG. 4 is a block diagram of decoding circuitry for the test operation, according to the invention.

FIG. 4 shows a construction of decoding circuitry for conducting the test operation shown in FIG. 3. Referring to FIG. 4, as assumed that the number of wordlines arranged in a array block is 512, a unit of decoding block 401 or 404, corresponding to one of the array blocks, is constructed of 128 main decoders MD0~MD127 and 512 sub wordline drivers SWD0~SWD511. Each main decoder is assigned to four sub wordline drivers (128×4=512), and receives normal precharge signal NPREB and test precharge signal TPRE. Pre-decoding signals DRA234i (i=0~7), DRA56j (j=0~3), DRA78k (k=0~3), and DRA910l (l=0~3) are applied to the main decoders MD0~MD127 of the first decoding block 401. The pre-decoding signals DRA234i (i=0~7), DRA56j (j=0~3), and DRA78k (k=0~3) are also applied to main decoders of the decoding block 404. One of the pre-decoding signals DRA910l (l=one of 0~3), e.g., DRA9100, is applied to the main decoders of the decoding block 401, while another one of the pre-decoding signals DRA910l (l=one of 0~3), e.g., DRA9103, is applied to the main decoders of the decoding block 404. Namely, as shown in FIG. 4, each combination with four pre-decoding signals from DRA234i, DRA56j, and DRA910l selects each main decoder. The pre-decoding signals DRA234i (i=0~7), DRA56j (j=0~3), and DRA78k (k=0~3) are to designate the main decoders. DRA910l (l=0~3) are to designate cell array blocks corresponding to the decoding blocks, and DRA01m (m=0~3) to designate the sub wordline drivers.

One of the pre-decoding signals DRA910l (l=0~3), e.g., DRA9100, and DRA01m (m=0~3) are also applied to wordline drive signal generator 430 which supplies wordline drive signals PX/PXB0n (n=0~3) to the sub wordline drivers SWD0~SWD512 of the decoding block 401, each four by four (i.e., four wordline drive signals are applied to each group of four sub wordline drivers). The pre-decoding signals DRA01m (m=0~3) are also applied to wordline drive signal generator 434, together with DRA9103, which supplies wordline drive signals PX/PXB0n (n=0~3) to the sub wordline drivers SWD0~SWD5 11 of the decoding block 404, each four by four (i.e., four wordline drive signals are applied to each group of four sub wordline drivers). The main decoders MD0~MD127 generate wordline enable signals NWE0~NWE127, respectively. Each of the wordline enable signals is applied to four sub wordline drivers (e.g., NWE0 is applied to SWD0~SWD4). The sub wordline drivers are assigned to wordlines one by one, receiving the wordline enable signal and the wordline drive signal.

Figure 5:
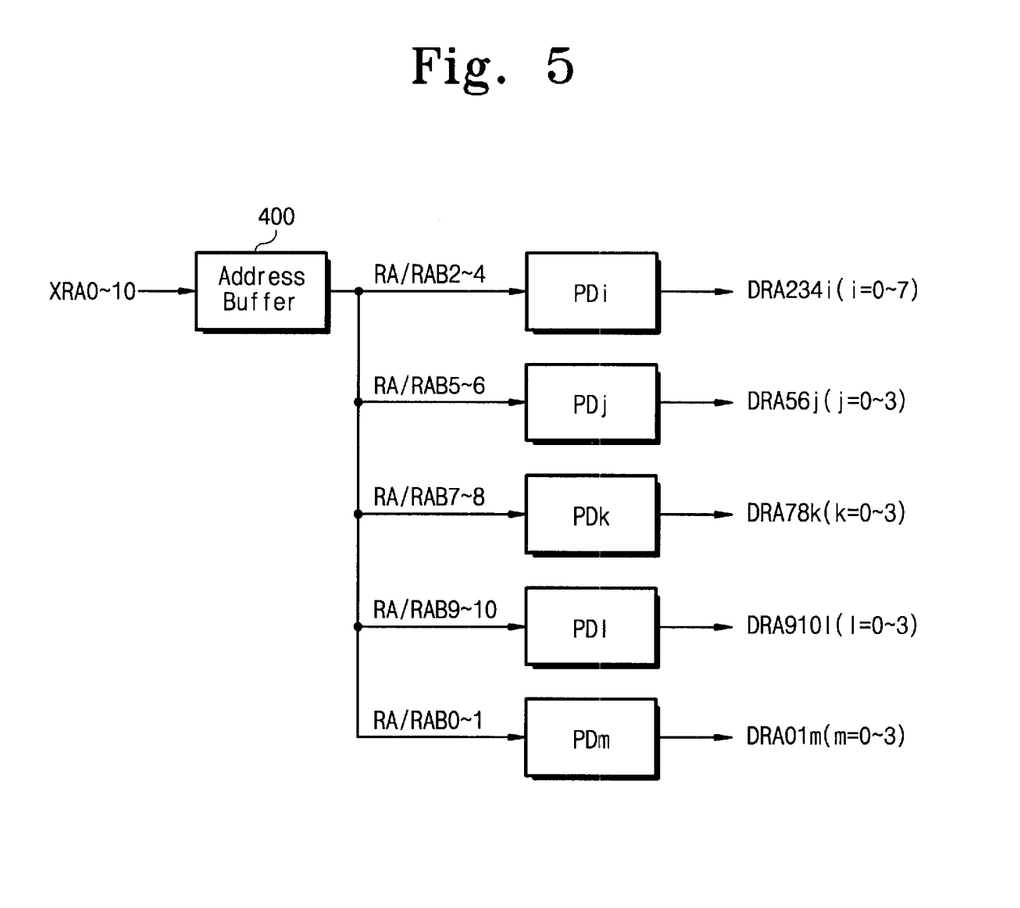
FIG. 5 is a block diagram of pre-decoders for the decoding circuitry shown in FIG. 4.
Figure 6A:
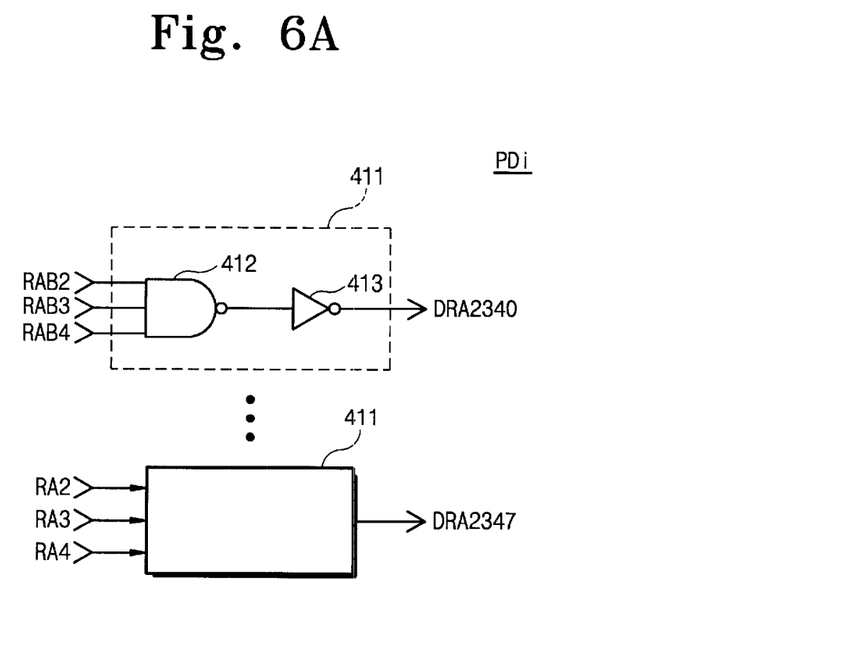
FIGS. 6A and 6B are circuit diagrams of the pre-decoders shown in FIG. 5.
Figure 6B:
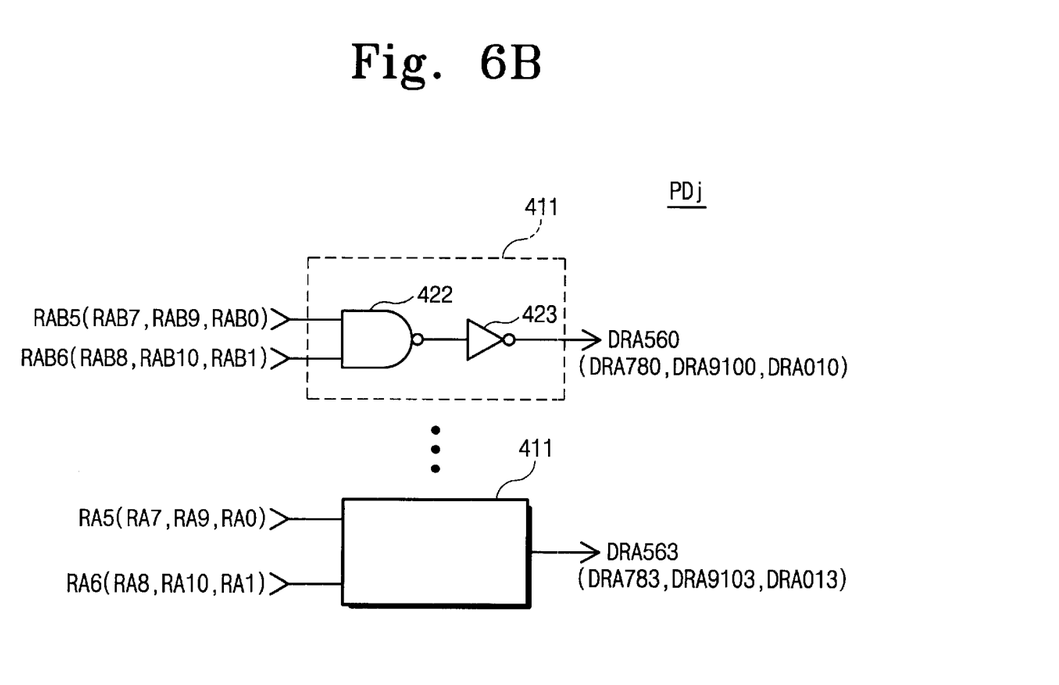

Referring to FIG. 5, pre-decoders, PDi, PDj, PDk, PDl and PDm, for generating the pre-decoding signals DRA234i, DRA56j, DRA78k, DRA910l, and DRA01m receive row address signals RA/RAB2~4, RA/RAB5~6, RA/RAB7~8, RA/RAB9~10, and RA/RAB01, supplied from address buffer 400 that receives external address signals XRA0~10, respectively. Of the row address signals XRA0~10: XRA2~8 are used for designating the 128 main decoders; XRA9~10 are used for designating 4 cell array blocks corresponding to the 4 decoding blocks 401~404; and XRA0 and XRA1 are assigned to select 4 sub wordline drivers (e.g., SWD0~SWD3). The pre-decoder is formed of units 411, each corresponding to the pre-decoding signals, as shown in FIGS. 6A and 6B. The pre-decoding unit is constructed of NAND gate 412 receiving row address signals (e.g., RAB2~RAB4), and inverter 413 generating a pre-decoding signal (e.g., DRA2340) in response to an output of the NAND gate 412.

Figure 7:
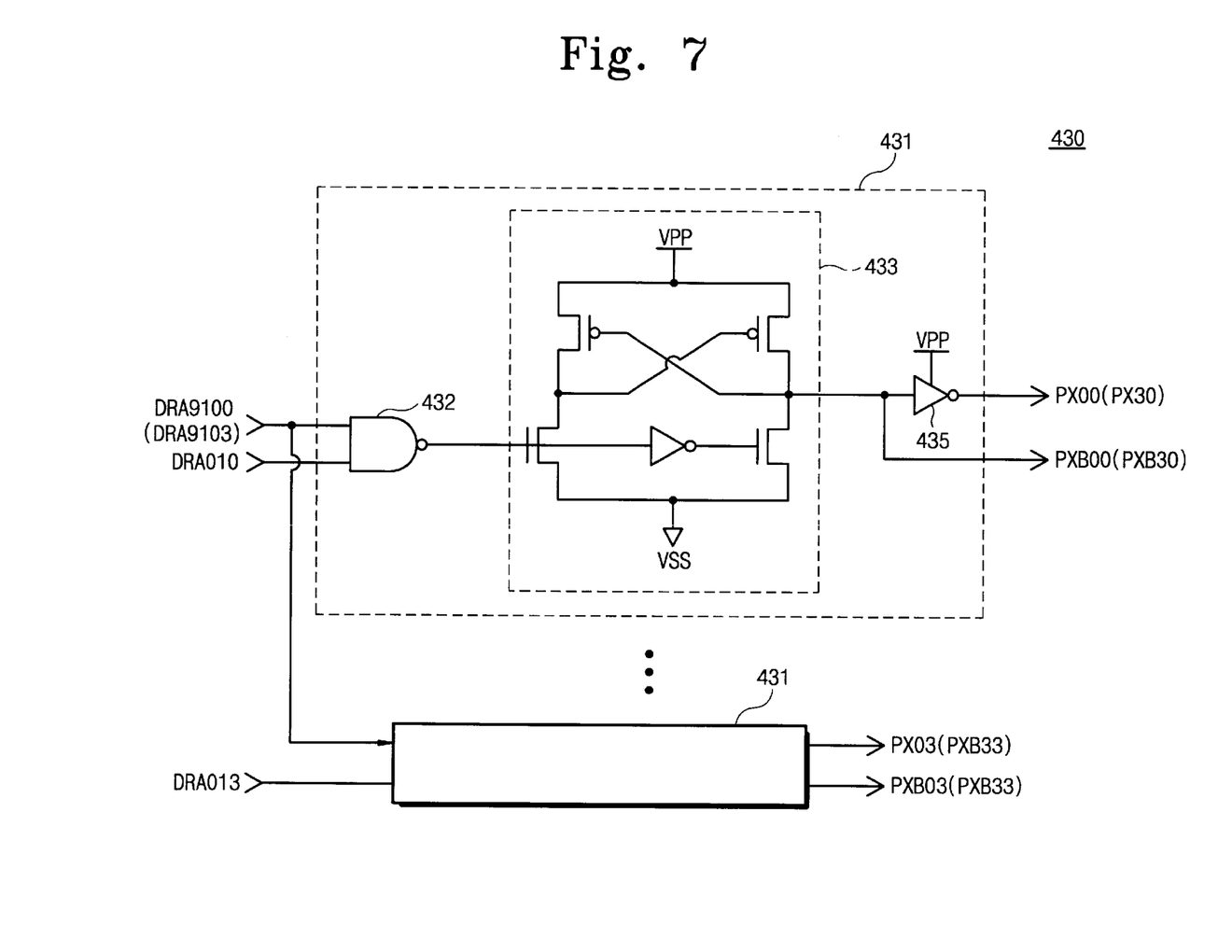
FIG. 7 is a circuit diagram of wordline drive signal generators shown in FIG. 4.

Referring to FIG. 7, the wordline drive signal generator 430 or 434 is formed of units corresponding to the number of pairs of the wordline drive signals (e.g., four pairs PX00/PX00B~PX03/PX03B). The units receive DRA9 100 in common, and respectively receive DRA010~DRA013. Each of the units is constructed of NAND gate 432 receiving the pre-decoding signals DRA9100 and DRA010, level shifter 433 receiving an output of the NAND gate 432, and inverter 435 converting an output of the level shifter 433 into the wordline drive signal (e.g., PX00). The output of the level shifter 433 becomes PX00B, which is a complementary signal of PX00. The level shifter 433 and the inverter 435 employs a boosting voltage (or a pumping voltage) VPP while the NAND gate 432 does a normal power supply voltage VCC that is lower than VPP, in order to drive a corresponding wordline on the boosting voltage to overcome a voltage loss.

Figure 8:
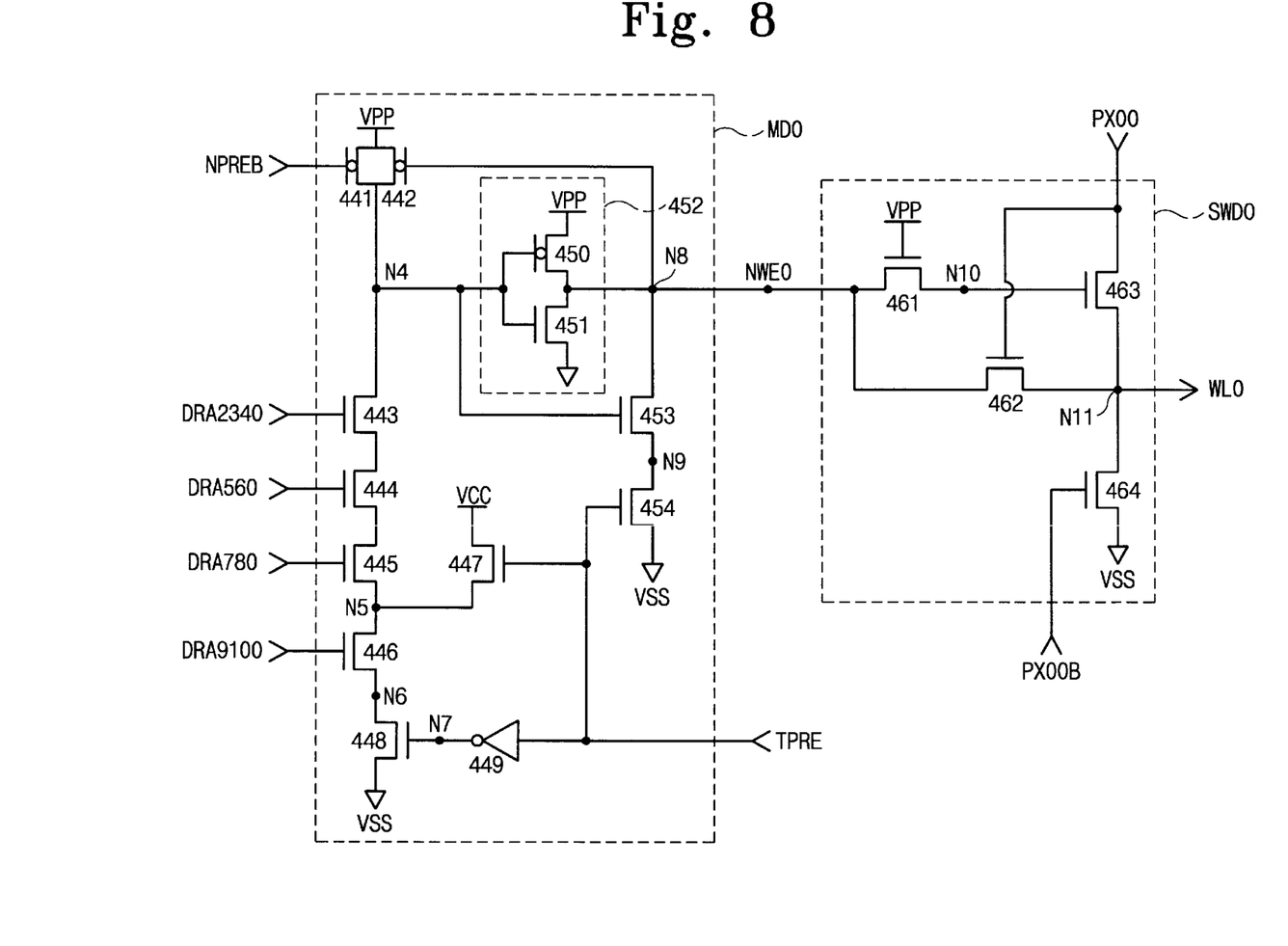
FIG. 8 is a circuit diagram showing an interconnection feature between a main decoder and a sub wordline driver shown in FIG. 4.

FIG. 8 shows constructions of the main decoder (e.g., MD0) and the sub wordline driver (e.g., SWD0), including an interconnection feature between those. In the main decoder, PMOS transistors 441 and 442 are connected between VPP and node N4 in parallel.

The gate of PMOS transistor 441 is coupled to the normal precharge signal NPREB. The gate of PMOS transistor 442 is coupled to output node N8, which is connected to VSS through NMOS transistors 453 and 454. The node N4 is connected to the output node N8 through inverter 452 which employs VPP as a power source, and also coupled to the gate of NMOS transistor 453. NMOS transistors 443 446 and 448 are connected between the node N4 and a ground voltage (or a substrate voltage) VSS. Gates of the transistors 443~446 are coupled to pre-decoding signals DRA2340, DRA560, DRA780, and DRA9100, respectively. NMOS transistor 447 is connected between VCC and node N5 interposed between NMOS transistors 445 and 446. The test precharge signal TPRE is applied to gates of NMOS transistors 447 and 454, and to the gate of NMOS transistor 448 through inverter 449. The wordline enable signal (e.g., NWE0) is generated from output node N8.

In the sub wordline driver (e.g., SWD0), the wordline enable signal is applied to the gate of NMOS transistor 463 through NMOS transistor 461, whose gate is coupled to VPP, and also applied to output node N11 which is connected to a corresponding wordline (e.g., WL0). The gate of NMOS transistor 462 is coupled to a corresponding wordline drive signal (e.g., PX00) together with the drain of NMOS transistor 463. The output node N11 is connected to VSS through NMOS transistor 464,whose gate is coupled to a corresponding wordline drive signal (e.g., PX00B; a complementary signal of PX00).

Figure 9:
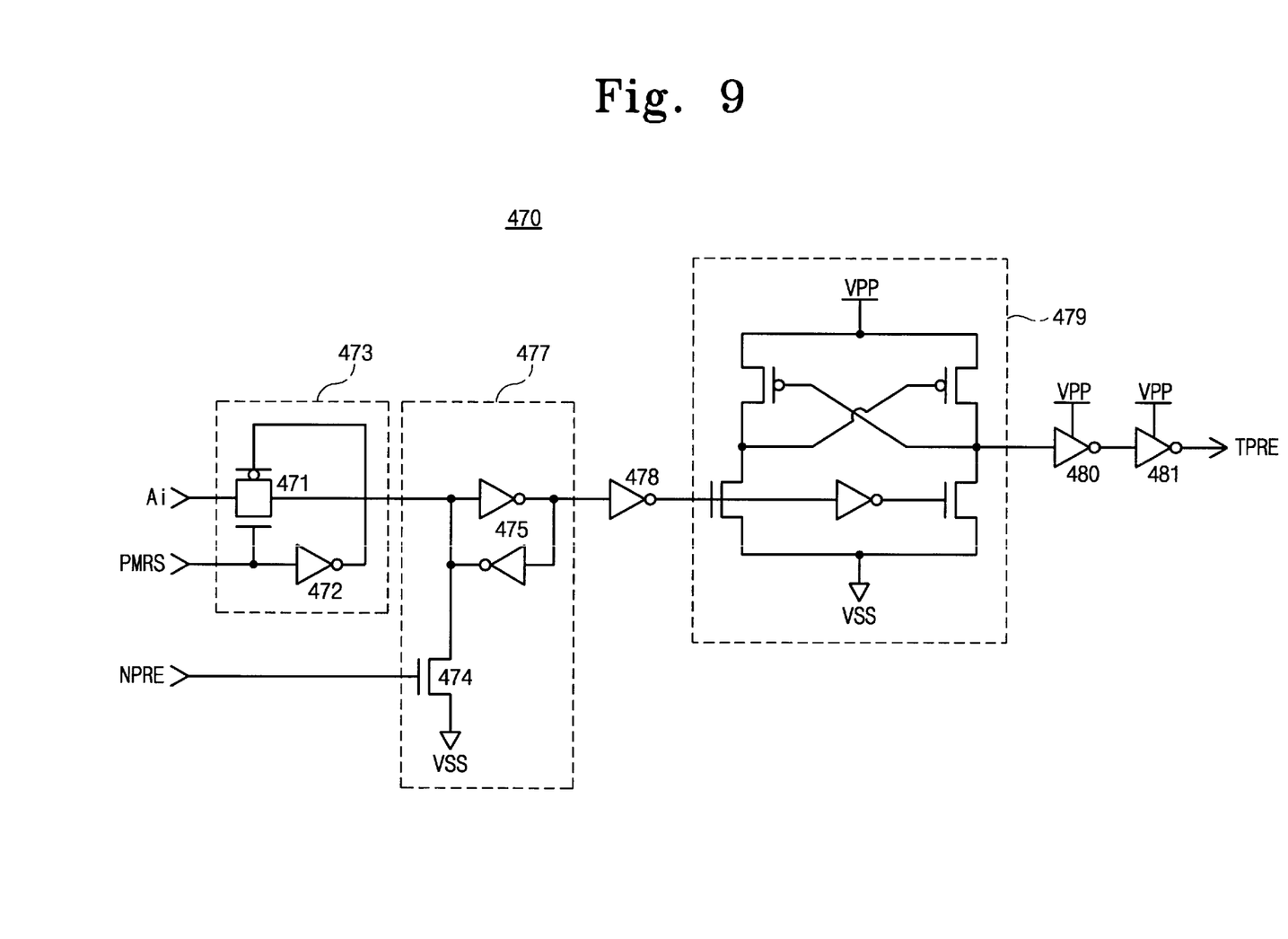
FIG. 9 is a circuit diagram of a test mode precharge controller generating a test mode precharge signal for the decoding circuitry of FIG. 4.

Referring to FIG. 9, the test precharge signal TPRE is produced responsive to an if address signal Ai, mode reset signal PMRS, and normal precharge signal NPRE. The address signal Ai is applied to latch circuit 475 through transmission gate 473, controlled by PMRS that is conductive in a MRS (mode register set) cycle. An input node of the latch circuit 477 is connected to VSS through NMOS transistor 474, whose gate is coupled to NPRE. An output node of latch circuit 477 is connected to level shifter 479 through inverter 478. An output of level shifter 479 is converted into the test precharge signal TPRE through serially connected inverters 480 and 481. The test precharge signal TPRE is established by applying a high voltage to a specific pin.

Figure 10:
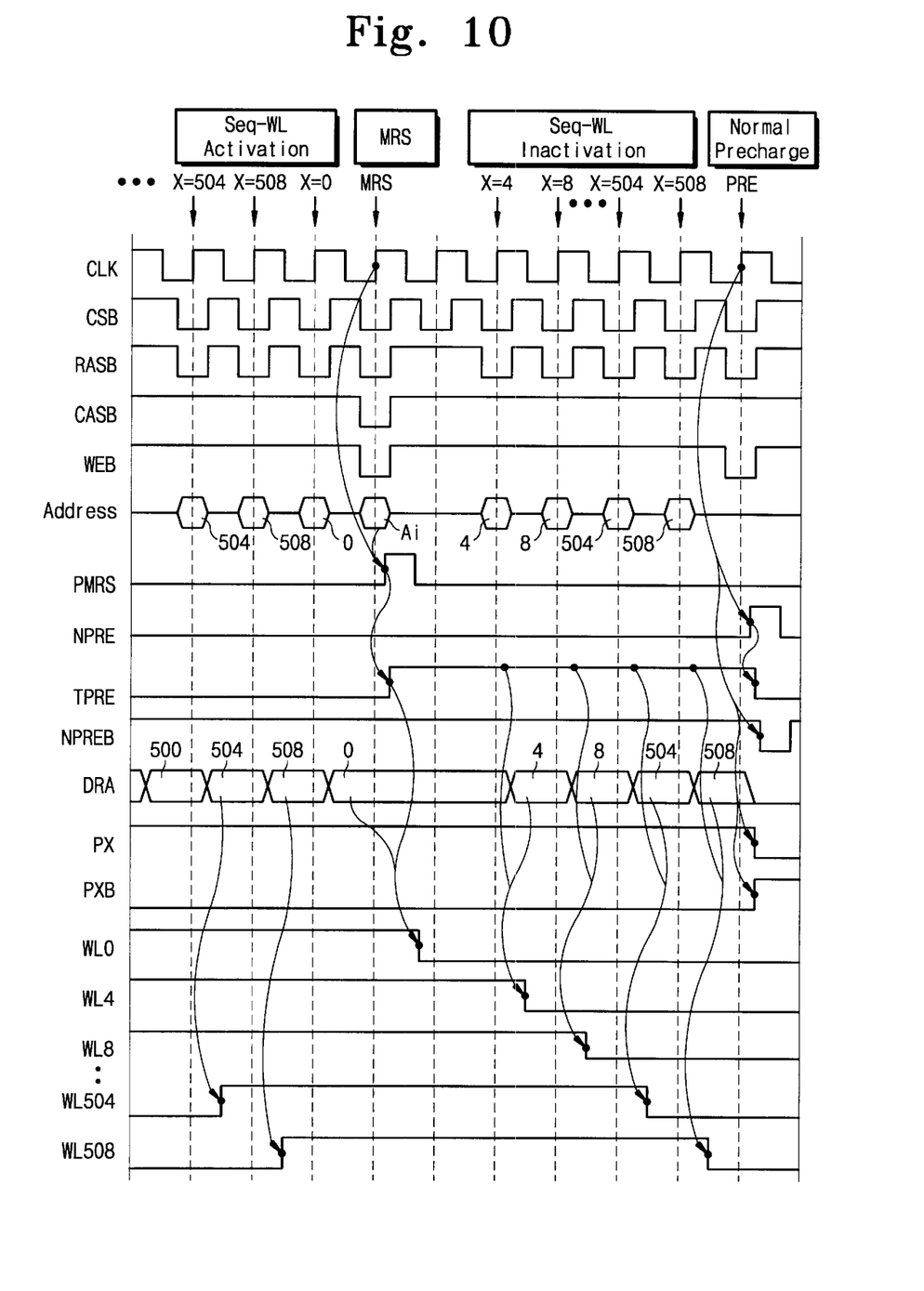
FIG. 10 is a timing diagram of a decoding operation according to the invention.

Now, referring to FIG. 10, a procedure for controlling the wordlines during a test operation will be described in detail, following with the sequential flow of FIG. 3.

First, in the sequential wordline activation mode corresponding to the step S33 of FIG. 3, the combinational coding with the external address bits XRA2~4 (corresponding to RA/RAB2~4 and DRA234i), XRA5~6 (corresponding to RA/RAB5~6 and DRA56j), and XRA7~8 (corresponding to RA/RAB7~8 and DRA78k) is carried out to activate the wordline enable signals NWE0~NWE127 in the state of holding XRA9~10 (corresponding to RA/RAB9~10 and DRA9101) and XRA0~1 (corresponding to RA/RA0~1 and DRAO1m). As understood in FIGS. 3 and 4, DRA9100 oriented from a corresponding code of XRA9~10 (e.g., [XRA9:XRA10]=[00]), for selecting the four cell array blocks, does not change until the next cell array block is selected therein, and DRA010 oriented from a corresponding code of XRA0~1 (e.g., [XRA0:XRA1]=[00]), for selecting the four sub wordline driver (or the four wordlines), does change until operations for selecting the wordlines WL0/WL508 (WL0, WL4, ..., WL508) are finished. Namely, it may be expected that the code [XRA9:XRA10] is changed from [00], [01], [10], and [11], in order, for selecting the four cell array blocks 401~404 corresponding thereto, and the code [XRA0:XRA1] is changed from [00] to [11] for selecting the four sub wordline drivers SWD0~SWD3 per each [XRA9:XRA10].

Therefore, the combinational codes will be assigned to the following features for activating the four wordline selection groups WL0/WL508, WL1/WL509, WL2/WL510, and WL3/WL511, respectively, of the first cell array block 401: WL0/WL508 to [XRA9: XRA10]=[00], [XRA0: XRA1]=[00], and [XRA2: XRA8]=[0000000]~[1111111]; WL1/WL509 to [00], [01], and [0000000]~[1111111]; WL2/WL510 to [00], [10], and [0000001]~[1111111]; WL2/WL510 to [00], [10], and [0000000]~[1111111]; and WL3/WL511 to [00], [11], and [0000001]~[1111111]. For the fourth cell array block 404, the patterns of the binary codes with [XRA0: XRA1] and [XRA2: XRA8] are established as the same as those for the first cell array block except [XRA9:XRA10] of [11]. The timing diagram shown in FIG. 10 is to be applied to the case of activating WL0/WL508.

After activating WL0/WL508 in sequence by the aforementioned manner, the cell array block is put into a stress mode for a predetermined time at step S34. And then, the MRS mode is set when chip selection signal CSB, row address strobe signal RASB, column address strobe signal CASB, and write enable signal WEB are all low levels, enabling the mode reset signal PMRS to be at high level. The MRS mode is usually performed for two cycles of clock signal CLK in a synchronous memory device, as shown in FIG. 10.

For the purpose of inactivating the wordlines WL0/WL508, at step S35, the test precharge signal TPRE goes to high level from low level in response to the activated PMRS with high level, while the normal precharge signal NPRE remains at low level. In FIG. 10, TPRE of high level turns the NMOS transistor 448 off, and turns the NMOS transistor 454 on. Thus, when corresponding pre-decoding signals (e.g., DRA2340, DRA560, and DRA780) are applied to the gates of the NMOS transistors 443~445, the node N4 is charged to VCC-Vth (Vth is a threshold voltage of the NMOS transistor) through the conductive path of the NMOS transistors 447, 445, 444, and 443. During this phase, there is no current path through the NMOS transistor 446 whose gate is coupled to DRA9100 for selecting a cell array block because the NMOS transistor 448 is turned off by TPRE.

At this time, the voltage level on the node N4, VCC-Vth, is at an insufficiently high level to turn the output of the inverter 452, i.e., the output node N8, into a low level in a desired time because the inverter employs the boosting voltage VPP higher than VCC. The longer trip time due to the insufficient turn-on of PMOS transistor 450, or the insufficient high level of VCC-Vth in inverter 452, is subsumed by NMOS transistors 453 and 454, which pull output node N8 down to low level quickly in response to the high levels of TPRE and N4.

As the wordline enable signal NWE0 is turned down to low level in response to the corresponding pre-decoding signals DRA2340, DRA560, and DRA780, PMOS transistor 463 is turned on. The wordline drive signal PX00B of low level turns NMOS transistor 464 on, and thereby the corresponding wordline WL0 is inactivated at low level. Other wordline enable signals NWE1~NWE127 are generated as low levels to inactivate the wordlines WL0/WL508 in sequence whenever their corresponding pre-decoding signals are applied to the gates of NMOS transistors 443~445, as shown in FIG. 10, regardless of the state of the block selection pre-decoding signal DRA9100. The wordline drive signals PX00 and PX00B retain high and low levels, respectively, until the inactivation operation for WL0/WL508 is over.

After inactivating the wordlines WL0/WL508, the normal precharge mode for all bitlines (step S36) starts with NPRE with high level (NPREB is low level) when CSB, RASB, and WEB are low levels and CASB is high level. The test precharge signal TPRE falls down to low level. The wordline drive signals PX00 and PX00B are disabled to low and high levels, respectively. Then, all the bitlines of the cell array block are precharged to a predetermined level.

Figure 11A:
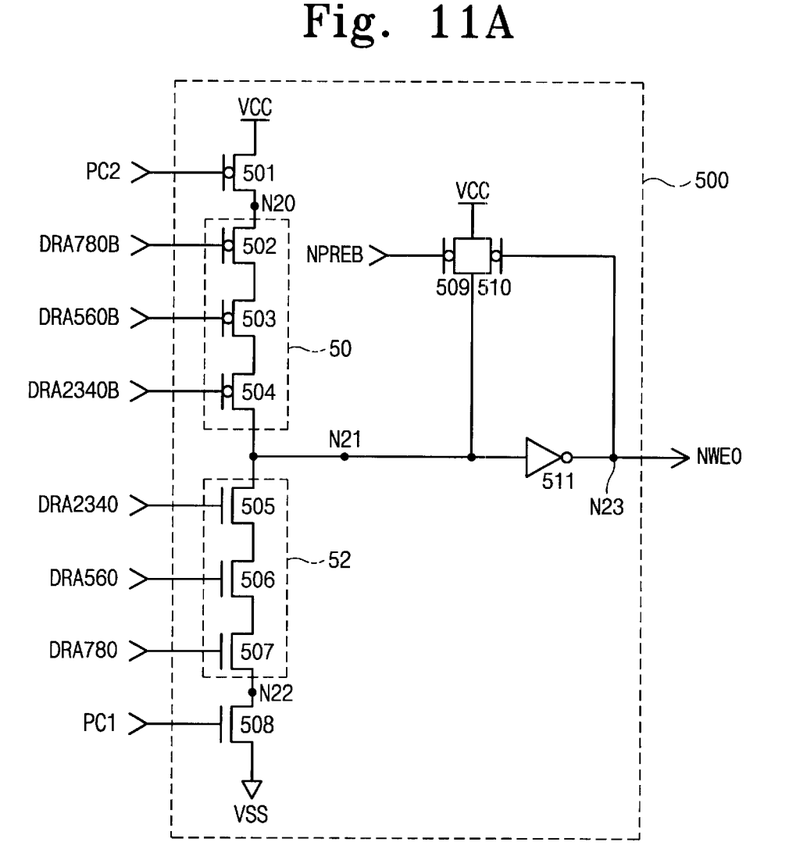
FIG. 11A is a circuit diagram showing another embodiment of the main decoder.
Figure 11B:
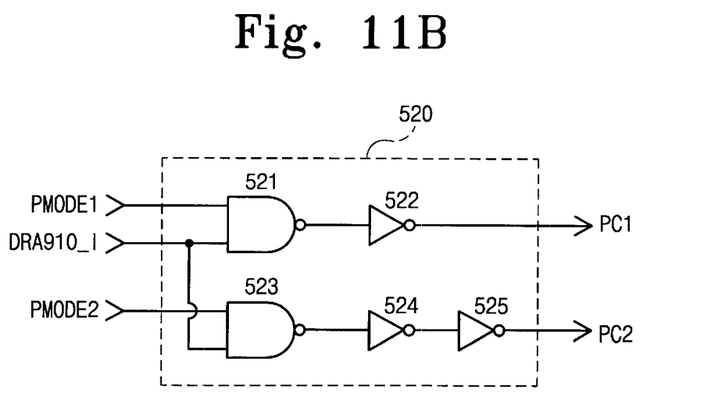
FIG. 11B is a circuit diagram of a precharge controller for the main decoder of FIG. 11A.

FIGS. 11A and 11B show circuit constructions for another embodiment of the main decoder, addressing other features of the precharge signals. Referring to FIG. 11A, the other main decoder type according to the invention employs two precharge signals PC1 and PC2, instead of NPREB and TPRE of FIG. 8, generated from circuit 520 shown in FIG. 11B. PC2 is applied to gate of PMOS transistor 501, whose source is connected to VCC and drain to node N20. Between the drain of PMOS transistor 501 and node N21, PMOS transistors 502, 503, and 504 are connected in serial to construct pull-up circuit 50. The gates of PMOS transistors 502~504 are each coupled to the pre-decoding signals DRA780B, DRA560B, DRA2340B. Between node N21 and Vss, NMOS transistors 505, 506, 507, and 508 are connected in serial. NMOS transistors 505~507 form pull-down circuit 52. The gates of NMOS transistors 505~508 are each coupled to DRA2340, DRA560, DRA780, and PC1. The node N21 is connected to output node N23 through inverter 511. Between VCC and the node N21 are connected PMOS transistors 509 and 510 in serial. The wordline enable signal NWE0 is generated from the output node N23. Gates of the PMOS transistors 509 and 510 are coupled to the normal precharge signal NPREB and the output node N23.

Referring to FIG. 11B, the first precharge signal PC1 is generated through NAND gate 521 and inverter 522. The NAND gate 521 receives the first mode signal PMODE1 and the pre-decoding signal DRA9100 that is used for selecting a cell array block as in FIG. 8. The second precharge signal PC2 is generated through NAND gate 523 and inverters 524 and 525. The NAND gate 523 receives the second mode signal PMODE2 and the pre-decoding signal DRA9100.

The first mode signal PMODE1 is enabled for an active mode where plural wordlines are being conductive, and makes PC1 be high level when the pre-decoding signal DRA9100 is being active with high level to select its corresponding cell array block. During an activation of PC1, high leveled pre-decoding signals DRA234, DRA56, and DRA78 pull a voltage level at the node N21 down to low level, thereby causing the wordline enable signal NWE0 to be high level. The enabled NWE0 activates four sub word-line drivers SWD0~SWD3, which are assigned four wordlines. A multiplicity of combinational codes with the pre-decoding signals activates a multiplicity of wordline enable signals.

Although the pre-decoding signals DRA780B, DRA560B, and DRA2340B, as complementary signals of DRA780, DRA560, and DRA2340, respectively, are applied to pull-up circuit 50 when the main decoder is selected to generate the high-leveled NWE0, the pull-up circuit can not be turned on because the second precharge signal PC2 is disabled with high level to shut the PMOS transistor 501 off due to the second mode signal PMODE2 of low level not affecting an invalid activation of the wordlines. The second mode signal PMODE2 is conductive during a test mode precharge cycle where a plurality of wordline enable signals are disabled, being activated after an activation of the plural wordlines is over. While MODE2 is being conductive, the first mode signal PMODE1 is disabled with low level and thereby PC2 becomes low level to turn the PMOS transistor 508 out. During the activation of PC2, the complementary pre-decoding signals are applied to the pull-up circuit 50 to charge the node N21 up to high level, and then NWE0 is disabled to make corresponding wordlines (e.g., WL0~WL3) be turned down. And, consequently, sequential changes of the pre-decoding signals with the activation of PC2 causes the plural wordline enable signals to be turned down to low levels.

It is available to modify the embodiments of the invention by varying the number of the cell array blocks, but limited in the four blocks, or without the block selection address bit (e.g., XRA910 corresponding to DRA910). In addition, the order of inactivating the wordlines can be changed by operating the incoming order of their corresponding address bits. For example, it is possible to inactivate the wordlines (e.g., WL0/WL508) in the order of WL0-WL8-WL4- . . . , not of WL0-WL4-WL8- . . . It should be noted that the sequential inactivation includes any order of inactivation of wordlines.

Furthermore, the number of wordlines inactivated in one time may be variable by adjusting the decoding patterns, further reducing at a test time. For example, the pre-decoding signal DRA234i is set on a normal-on state by using an inverted signal of TPRE that is high level in the inactivation mode, inactivating eight wordlines a time. Or, in FIG. 11A, grounding the gate of the NMOS transistor 504 or removing the NMOS transistor 504 makes the eight wordlines be inactivated at a time.

As described above, the invention is capable of reducing the ground noises by inactivating plural wordlines in sequential after a burn-in test operation.

While this invention has been described in connection with what is presently considered to be the practical and preferred embodiments, it is to be understood that the invention is not limited to the disclosed embodiment, but, on the contrary, is intended to cover various modifications and equivalent arrangements included within the scope of the invention.

What is claimed is:

1. A semiconductor memory device having a plurality of wordlines, the device comprising:
    main decoders for generating wordline enable signals in response to first decoding signals, a first precharge signal, and a second precharge signal;
    wordline drivers for generating wordline drive signals in response to the wordline enable signals and second decoding signals; and
    a circuit for generating the second precharge signal in response to a command signal;
    wherein the wordline drive signals are sequentially inactivated in response to the first decoding signals and the second precharge signal.

2. The semiconductor memory device of claim 1, wherein the wordline drive signals are sequentially inactivated one by one.

3. The semiconductor memory device of claim 1, wherein the wordline drive signals are inactivated more than one at a time.

4. The semiconductor memory device of claim 1, wherein the first precharge signal is enabled during a normal precharge mode.

5. The semiconductor memory device of claim 4, wherein the command signal causes the second precharge signal to become enabled or disabled in response to a mode register set cycle and the normal precharge mode, respectively.

6. The semiconductor memory device of claim 4, wherein the command signal controls the second precharge signal by using a high voltage applied to a pin of the device.

7. A semiconductor memory device having a plurality of wordlines, the device comprising:
    main decoders for generating wordline enable signals in response to first decoding signals, complementary signals of the first decoding signals, a first precharge signal, and a second precharge signal;
    wordline drivers for generating wordline drive signals in response to the wordline enable signals and second decoding signals; and
    a circuit for generating the first precharge signal to activate the wordline drive signals, and for generating the second precharge signal to inactivate the wordline drive signals, in response to a first mode signal and a second mode signal;
    wherein the wordline drive signals are sequentially inactivated in response to the complementary signals of the first decoding signals and the second precharge signal.

8. The semiconductor memory device of claim 7, wherein the wordline drive signals are sequentially inactivated one by one.

9. The semiconductor memory device of claim 8, wherein the first mode signal is enable during an active mode where the wordline drive signals are activated, and the second mode signal is enable during a test precharge mode where the wordline drive signals are inactivated.

10. The semiconductor memory device of claim 7, wherein the wordline drive signals are inactivated more than one at a time.

11. The semiconductor memory device of claim 10, wherein the first mode signal is enable during an active mode where the wordline drive signals are activated, and the second mode signal is enable during a test precharge mode where the wordline drive signals are inactivated.

12. A method for testing a semiconductor memory device having a plurality of wordlines, the method comprising:

generating wordline enable signals responsive to first decoding signals, complementary signals of the first decoding signals, a first precharge signal, and a second precharge signal;

generating wordline drive signals responsive to the wordline enable signals and second decoding signals;

activating the wordline drive signals responsive to the first precharge signal; and sequentially inactivating the wordline drive signals responsive to the complementary signals of the first decoding signals and the second precharge signal.

13. The method of claim 12, further comprising:

enabling a first mode signal during an active mode where the wordline drive signals are activated; and enabling a second mode signal during a test precharge mode where the wordline drive signals are inactivated.

* * * * *